United States Patent [19]

Lie

[11] Patent Number: 4,585,956
[45] Date of Patent: Apr. 29, 1986

[54] SWITCHED CAPACITOR FEEDBACK SAMPLE-AND-HOLD CIRCUIT

[75] Inventor: Hans P. Lie, Berkley Heights, N.J.

[73] Assignee: AT&T Bell Laboratories, Murray Hill, N.J.

[21] Appl. No.: 662,245

[22] Filed: Oct. 18, 1984

Related U.S. Application Data

[63] Continuation-in-part of Ser. No. 426,293, Sep. 29, 1982, abandoned.

[51] Int. Cl.$^4$ ............................................. G11C 27/02
[52] U.S. Cl. .................................... 307/353; 307/359; 307/491; 307/572
[58] Field of Search ................... 307/352, 353, 200 A, 307/200 B, 359, 555, 568, 572, 573, 491, 443; 328/151; 333/173

[56] References Cited

U.S. PATENT DOCUMENTS

| | | | |
|---|---|---|---|
| 3,586,880 | 6/1971 | Fitzwater, Jr. | 307/353 |
| 4,308,468 | 12/1981 | Olson | 307/353 |
| 4,331,894 | 5/1982 | Gregorian et al. | 307/352 |
| 4,352,070 | 9/1982 | Beauducel et al. | 307/353 |

OTHER PUBLICATIONS

S. K. Sunter et al, A Programmable Transversal Filter for Voice-Frequency Applications", IEEE Jour. of Solid-State Circuits, vol. SC-16, No. 4, Aug. 1981, pp. 367-371.

Primary Examiner—John Zazworsky
Attorney, Agent, or Firm—Volker R. Ulbrich

[57] ABSTRACT

A feedback sample and hold circuit bank (10) of 24 stages (12) is described. The bank (10) is of the type having an operational amplifier common to all the stages (12) and having its output connected to each stage (12) through a sampling switch ($S_S$) to the input of a buffer (B). A holding capacitor ($C_H$) is connected between input of the buffer (B) and ground potential. A correction coupling capacitor ($C_{CC}$) and a correction holding capacitor ($C_{CH}$) are connected respectively in series between the input of the buffer (B) and ground. A correction switch $S_C$ is connected between the amplifier output (14) and the common node (22) of the correction capacitors ($C_{CC}$, $C_{CH}$). When the sampling switch ($S_S$) opens for the hold condition, the correction switch ($S_C$) briefly remains closed to permit the amplifier (A) to correct the hold voltage for switching charge feedthrough error from the sampling switch ($S_S$) by charging the correction holding capacitor ($C_{CH}$). The correction coupling capacitor ($C_{CC}$) couples this correction in attenuated form to the holding capacitor ($C_H$). Also disclosed is a modification (24) including a connection zeroing switch ($S_{CZ}$) which periodically zeroes the common node (22) of the correction capacitors ($C_{CC}$), ($C_{CZ}$) so that large signal amplitudes can be better corrected.

9 Claims, 4 Drawing Figures

SWITCHED CAPACITOR FEEDBACK SAMPLE-AND-HOLD CIRCUIT

CROSS-REFERENCES TO RELATED APPLICATIONS

This is a continuation-in-part of application Ser. No. 426,293, filed Sept. 29, 1982 in the name of the present inventor and now abandoned.

BACKGROUND OF THE INVENTION

The invention relates to feedback sample-and-hold circuits. Sample-and-hold circuits are used for example, in electronic integrated circuits for delay functions and find application alone and in banks of stages for time domain filtering, such as in a transversal filter. The FIG. 1 illustrates a known arrangement of a number of sample-and-hold circuit stages interconnected as a bank to work in conjunction with a common operational amplifier A. Each of the N stages, shown enclosed by a broken line, includes a basic sample-and-hold circuit section and a switched feedback path connecting the output of the sample-and-hold circuit to the inverting input of the amplifier A. The sample-and-hold circuit sections each include a sampling switch $S_S$, a holding capacitor $C_H$, and a buffer B. The sampling switches $S_S$ are operated successively by pulses of a set of individually associated primary sampling switching pulse trains $T_S$. The feedback sections include feedback enabling switches $S_F$, which are operated successively by pulses of a second set of switching pulse trains $T_F$ so that the feedback for any particular stage is enabled during the entire sample-and-hold process of that stage. The details of the switching pulse electrical connections to the sampling switches $S_S$ and the feedback enabling switches $S_F$ are readily apparent to those skilled in the art and are not shown in the drawing in order to avoid crowding.

For understanding the general mode of operation of one of the stages it is useful to first assume that its sampling switch $S_S$ is in the conducting, closed condition, so that the signal output tracks the signal input. When the sampling switch $S_S$ is now opened, the output is held at a fixed hold value. If the switch $S_S$ is a perfect switch and the amplifier A and the buffer B are ideal, then the hold output will be precisely the same magnitude as the input which was present when the sampling switch $S_S$ was opened. The feedback loop in conjunction with the amplifier A reduces the effect of a voltage offset in the buffer B and in the sampling switch $S_S$ on the signal output. The sampling switch $S_S$ is generally an electronic switching device and is particularly well implemented by the use of one or more FET (field effect transistor) devices such as MOS (metal-oxide-semiconductor) transistors.

While MOS devices are particularly suitable for use as electronic switching devices, they are nevertheless not perfect. Because of coupling between the gate, source, and drain of the MOS device, unwanted error charge in the form of switching charge feedthrough is fed onto the holding capacitor $C_H$ after the MOS sampling switch $S_S$ is opened. At this time, since the sampling switch $S_S$ no longer conducts from source to drain, the operational amplifier A can no longer act to preserve the correct charge on the holding capacitor $C_H$. As a result, there arises a hold voltage offset, the magnitude of which is determined by the amount of charge feedthrough from the sampling switch $S_S$ to the holding capacitor $C_H$ divided by the capacitance value of the holding capacitor $C_H$. Since the capacitance magnitude of the holding capacitor $C_H$ limits the speed with which it can be charged, it is not possible to decrease the holding voltage offset by increasing at will the capacitance magnitude of the holding capacitor $C_H$.

One known way of decreasing the hold voltage offset has been to provide a charge feedthrough compensation switch across the sampling switch $S_S$. This is described, for example, in U.S. Pat. No. 4,308,468 issued Dec. 29, 1981 to Gaylord G. Olson. Such an approach significantly reduces the gross effects of the feedthrough charge for a particular switching device, but it does not deal with the effects of variations in feedthrough charge characteristics from one switching device to the next. Since in actual practice no two switches are identical, the feedthrough charge effect of each sampling switch $S_S$ is reduced by its associated compensation switch only to the extent that the feedthrough charge effects of both are identical. Thus, for a bank of feedback sample-and-hold circuits, the variations in the net charge feedthrough of the sampling switches $S_S$ and any compensating switches which may be connected across these still results in variations among the holding capacitor voltages, even when all the stages are sampling an identical signal. This produces a fixed pattern noise in a configuration in which the outputs of the sample-and-hold circuits are repeatedly sequentially sampled. This problem is discussed in relation to transversal filtering in, for example, "A Programmable Transversal Filter for Voice-Frequency Applications" by Sunter et al. in *IEEE Journal of Solid-State Circuits*, Vol. SC-16, No. 4, August 1981, pp. 367–371.

SUMMARY OF THE INVENTION

In accordance with the present invention, a secondary, correction sample-and-hold circuit is connected in parallel with the primary sample-and-hold circuit and has its output coupled to the primary circuit signal path through an attenuating means for substantially correcting switching charge feedthrough error introduced by the sample-and-hold switch when the primary circuit switches from its sampling to its hold condition.

In one form of the invention, a correction sampling switch and correction holding capacitor are connected in series, respectively, between the output port of the amplifier and a reference potential, normally ground potential, to provide the correction sample-and-hold circuit. A correction coupling capacitor is connected to the common node of the correction sampling switch and the correction holding capacitor on one side and to the common node of the primary sampling switch and the primary holding capacitor on its other side, thereby coupling an attenuated correction circuit output to the primary signal path.

For a brief time after the primary circuit has switched to its hold condition, the correction circuit provides an attenuated, secondary path for a feedback correction of the signal held in the primary circuit. The attenuating coupling correspondingly reduces the effect of any switching charge feedthrough error which would be likewise introduced by the switching of the secondary, correction circuit to its hold condition.

In another form of the invention, there is provided a correction zeroing switch connected between a reference potential and the common node of the correction holding capacitor and the correction sampling switch for periodically zeroing that node, so that large signal amplitudes can be better corrected.

DETAILED DESCRIPTION

Figure 1:
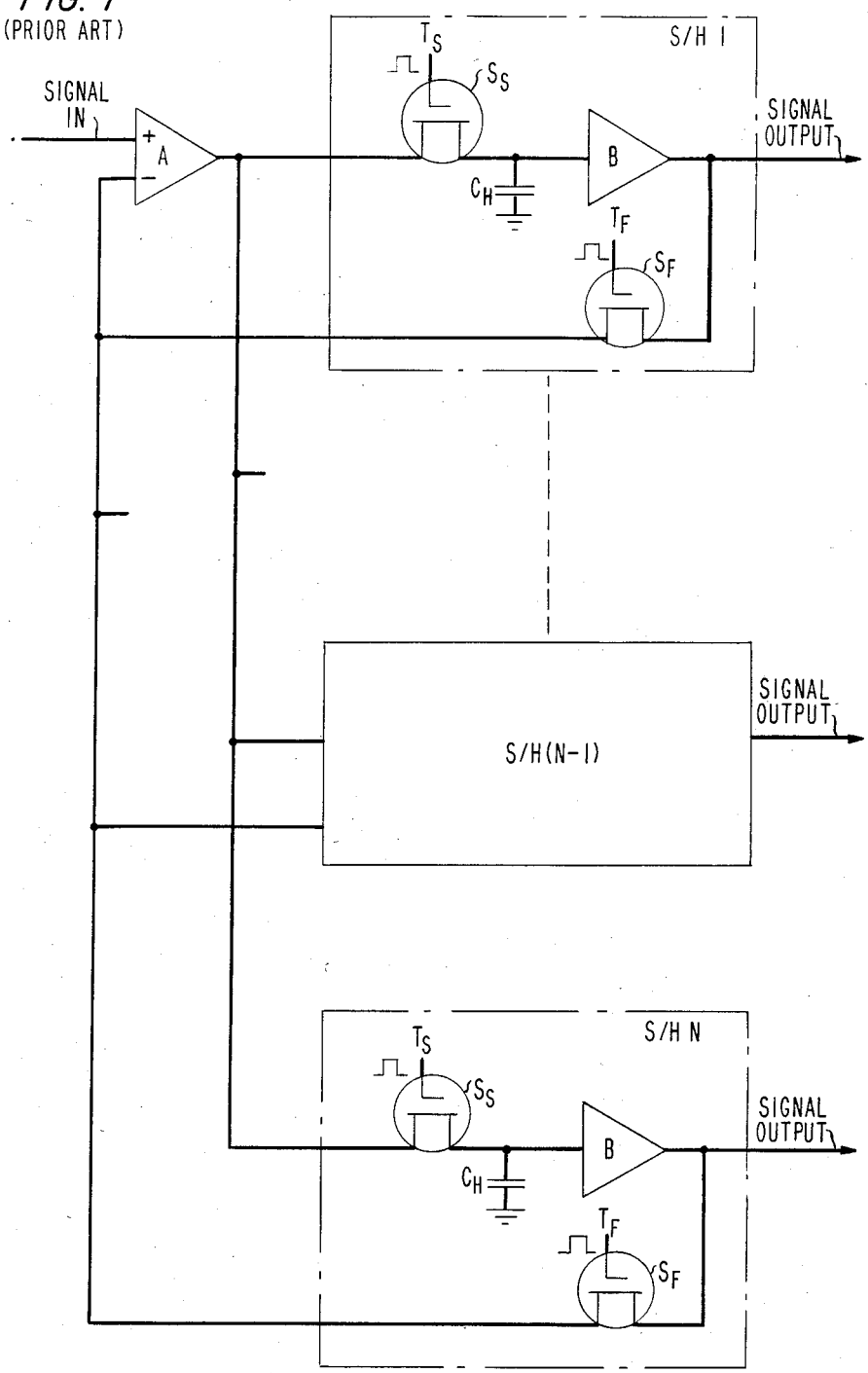
FIG. 1 is a schematic circuit diagram of a portion of a prior art feedback sample-and-hold circuit stage bank.
Figure 2:
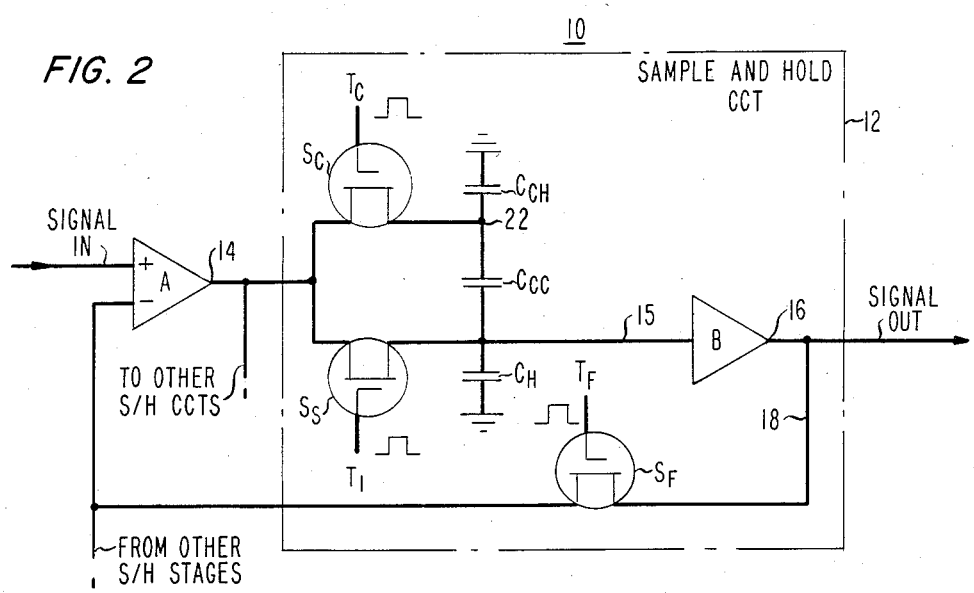
FIG. 2 is a schematic circuit diagram of a portion of a feedback sample-and-hold circuit stage bank in accordance with one example of the invention as described in the Detailed Description hereinafter.

The FIG. 2 of the drawings shows the first stage portion of a bank 10 of a plurality of MOS device feedback sample-and-hold circuit stages 12 in which all capacitors and transistor switches are MOS devices. The first stage portion is drawn to include a high performance, high gain operational amplifier A. The amplifier A has inverting ($-$) and noninverting ($+$) input ports and an output port 14. While only the first of the stages 12 is shown, it is to be understood that there are additional stages connected as a bank, with the amplifier A being common to them.

Each stage 12 includes a buffer B having an input port 15 and an output port 16. The output port 14 of the amplifier A is connected through an MOS transistor primary sampling switch $S_S$ to the input port 15 of the buffer B. The output port 16 of the buffer is connected to the inverting input port ($-$) of the amplifier A by a feedback path 18 in which there is a feedback enabling switch $S_F$.

A primary holding capacitor $C_H$ is connected between the input port 15 of the buffer B and ground potential. A correction coupling capacitor $C_{CC}$ with a capacitance substantially less than that of the holding capacitor $C_H$ and a correction holding capacitor $C_{CH}$ of about the same capacitance as the primary holding capacitor $C_H$ are connected in series, respectively, between the buffer B input port 15 and ground potential. A secondary, correction sampling switch $S_C$ couples the output port 14 of the amplifier A to the common node 22 of the correction holding capacitor $C_{CH}$ and the correction coupling capacitor $C_{CC}$. The switches $S_S$, $S_C$ are similar to each other. Each switch consists of an N-channel and a P-channel MOS transistor connected in parallel with their gates driven by appropriate switching control pulses. This known arrangement minimizes the charge feedthrough of the switch, since the complementary characteristics of the transistors leads to a substantial mutual cancellation of their individual charge feedthroughs. Signal input to the circuit 10 is to the noninverting input port ($+$) of the amplifier A. Signal output from the stage 12 is from the output port 16 of the buffer B.

The circuit configuration of the stage 12 provides a means by which the feedback loop 18 can be used to correct the hold voltage offset resulting from the opening of the sampling switch $S_S$. To accomplish this, the amplifier A stores a correction voltage $V_C$ on the correction holding capacitor $C_{CH}$. The charging of the correction holding capacitor $C_{CH}$ transfers charge through the correction coupling capacitor $C_{CC}$ to the holding capacitor $C_H$, thereby correcting the hold voltage offset contributed from the sampling switch $S_S$ charge feedthrough.

The switches $S_S$, $S_C$, $S_F$ are operated at the appropriate times as discussed below by respective switching pulse trains $T_S$, $T_C$, $T_F$ from connection to appropriate sources, not shown in the drawings, as would be readily apparent to one skilled in the art.

The mode of operation is as follows: with the feedback path 18 enabled and both the sampling switch $S_S$ and the correction switch $S_C$ closed during a signal tracking phase, the output is equal to the input. The sampling switch $S_S$ alone is then opened by the first pulse train $T_S$, leaving the holding capacitor $C_H$ charged to nearly the correct hold voltage value $V_H$, but with an error voltage $V_{error}$ resulting from the charge feedthrough from the sampling switch $S_S$. The correction switch $S_C$ will then provide a secondary path to permit the amplifier A to correct the hold voltage value $V_H$ by charging the correction holding capacitor $C_{CH}$ until the output is again equal to the input. At this time, the corrections witch $S_C$ is opened by the second switching pulse train $T_C$. Because the correction coupling capacitor $C_{CC}$ is of much smaller magnitude than the primary holding capacitor $C_H$, the offset voltage on the correction holding capacitor $C_{CH}$ caused by opening the correction switch $S_C$ will be attenuated with respect to the output voltage $V_{out}$ by approximately the factor $C_{CC}/C_H$.

Figure 3:
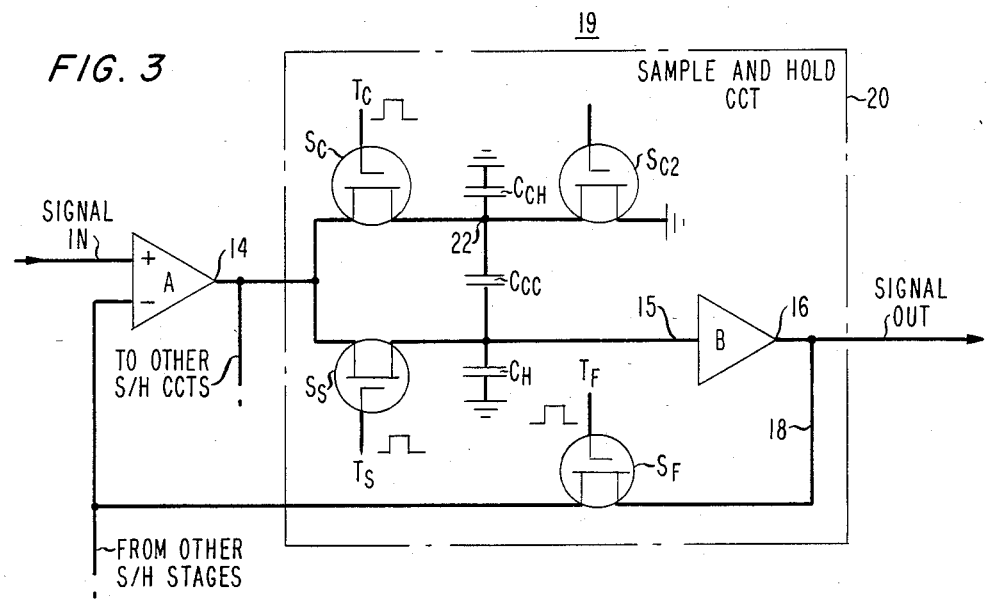
FIG. 3 is a schematic circuit diagram of the circuit stage of FIG. 2 as modified to include an additional correction zeroing switch.

A modification of the circuit 10 is the circuit 19 of FIG. 3, which is similar to the circut 10 except that its stage 20 is provided additionally with a correction zeroing switch $S_{CZ}$. This additional switch is connected between the common node 22 of the correction coupling and holding capacitors $C_{CC}$, $C_{CH}$ and ground potential and is also operated by the first pulse train $T_S$. This feature facilitates correction for large signal amplitudes by bringing the common node 22 to zero before each hold.

In the operation of the stage 20, the primary sampling switch $S_S$ and the correction zeroing switch $S_{CZ}$ are first closed during tracking of the signal, with the correction switch $S_C$ being open. Then the sampling switch $S_S$ and the correction zeroing switch $S_{CZ}$ are opened simultaneously by the primary sampling pulse train $T_S$, while the correction switch $S_C$ is simultaneously closed by the correction pulse train $T_C$. Since the voltage on the correction holding capacitor $C_{CH}$ is initially zero, or ground potential, the amplifier A can swing the correction voltage $V_C$ from zero to full scale in either direction, thereby providing the maximum correction voltage for large signal amplitudes. A disadvantage of this arrangement, however, is that the amplifier A will have to slew back to zero, or near zero, when a large input signal is present. This takes extra time, and thereby somewhat lengthens the time required for the holding function.

GENERAL CONSIDERATIONS

The objective of the circuits in accordance with the invention is to store a correction voltage which will substantially reduce the effect of the charge feedthrough from the primary sampling switch $S_S$. Since the correction voltage is also stored, a configuration must be used in which the effect of switch feedthrough when storing the correction voltage is less than the feedthrough of the primary sample-and-hold circuit. Since the error voltage caused by opening the primary sampling switch $S_S$ is on the order of ten millivolts, whereas the signal being stored is on the order of several volts, the stored correction voltage can be attenuated in its effect on the signal output, and there will still be sufficient range in the correction voltage to perform the necessary correction. Assuming that the correction voltage is stored using a switching means and a holding capacitor similar to the primary holding capacitor $C_H$, a bank of such circuits will exhibit the same variation in the correction voltage that the primary sample-and-hold circuits of the bank of stages exhibit in the output voltage. If, then, the correction voltages are attenuated in their effect on the respective signal outputs, the variation in the correction voltages produced by random differences in the correction switches $S_C$ will also be correspondingly reduced. From the viewpoint of obtaining the minimum fixed pattern noise, the attenuation of the correction signal should be as large as it can be, while assuring that the attenuated error voltage is large enough to correct for the worst error produced by feedthrough from the sampling switches $S_S$. However, since the attenuation of the correction voltage is an element in the feedback path loop associated with the amplifier A, it affects the settling time of the loop. Thus, constraints on the time allowed for the entire sample-and-hold operation may impose a more severe restriction on the amount of attenuation that can be used.

For typical practical applicaiton of the sample-and-hold circuit 10, e.g. where the input signal to the amplifier is audio frequency or higher, it is advisable to provide a sample-and-hold of the incoming signal before the input port of the amplifier. This prevents the signal level at the output port of the amplifier from undergoing significant change during the time that the correction sample-and-hold capacitor is being charged and thereby interfering with the accuracy of the correction.

Although the above discussion involves a bank 10 of sample-and-hold stages 12 which are coupled to each other, it should be understood that a single stage 12 could also be used alone with the amplifier A to perform a useful sample-and-hold function.

The buffer B prevents the circuitry connected to the signal output from altering the charge on the holding capacitor $C_H$. While in the stage 12 of the bank 10 it is a transistor, it could also be a nominal unity gain amplifier of another sort.

The sample-and-hold means can be any suitable sample-and-hold circuit configuration, and need not be the particular arrangement of a single sampling switch and holding capacitor as described for the stage 12 of the band 10.

The invention can be thought of in a general way as a method. If the very process of sampling and holding results in an error in the output signal, the present invention may be implemented to compare the actual, sampled input signal to the output signal and to generate a secondary, correction signal in response to the difference. The correction signal is coupled to the primary held signal through an attenuating means. The effect on the primary held signal of any error introduced in the course of the correction process, such as that resulting from the opening of the correction switch, is thereby also attenuated.

While in the circuits as described above the primary held signal is taken from the output of the differential amplifier, the primary held signal may also be sampled by the primary sampling switch directly from the signal input node, which is the noninverting input node of the amplifier in the circuits 10 and 19, or in any other way which will result in a circuit output voltage level which is a reasonably accurate approximation of the input signal at the time of sampling.

Figure 4:
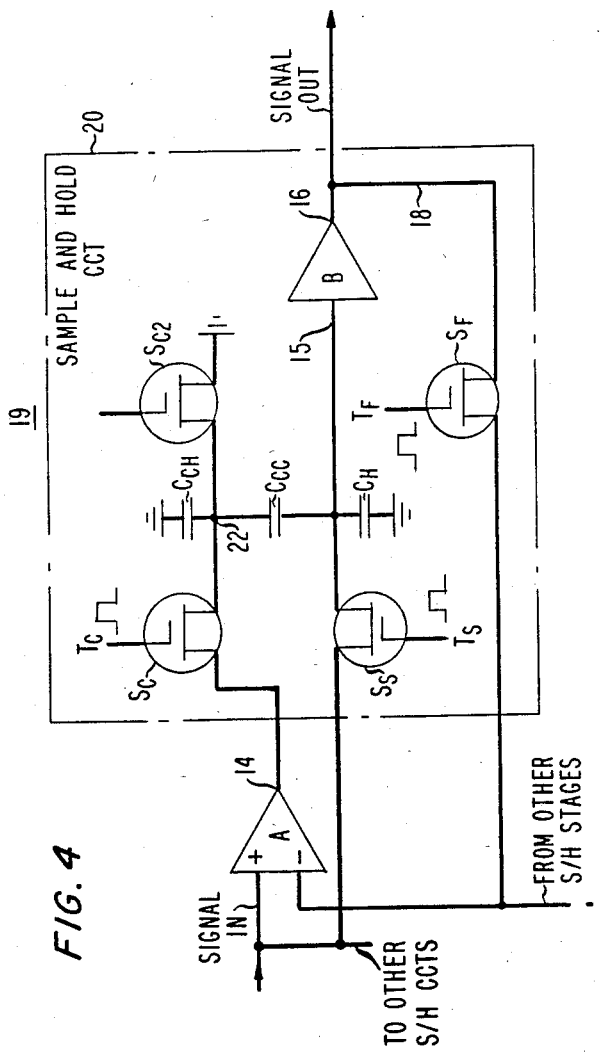
FIG. 4 is a schematic circuit diagram of the circuit stage of FIG. 2 modified for a different input signal connection.

The circuit 24 of FIG. 4 is such an arrangement. The reference symbols which designate elements corresponding to similar elements in the circuits of FIGS. 2 and 3 are retained. In the circuit 24, the input to the primary sampling switch $S_S$ is from the noninverting input port (+) of the amplifier A. Such an arrangement is feasible because the capacitances in the primary signal branch are sufficiently small to be charged directly by the signal to a sufficiently close approximation of the signal voltage to permit adequate correction.

While in the circuits 10 and 19 as described above the correction coupling means is a capatitor, other coupling means could also be used, provided that they result in an attenuated form of the correction signal being contributed to the signal output.

The reference potentials as various nodes of the sample-and-hold circuit in accordance with the invention need not necessarily be the same. In fact, in some instances it may be advantageous that they have different levels.

What is claimed is:

1. A sample-and-hold circuit apparatus of the type comprising:
    an amplifier having an inverting input port, a noninverting input port, and an output port, one of the input ports of said amplifier being connected to a signal input node;
    a buffer having an input port and an output port;
    a sampling switch connected between the amplifier output port and the input port of said buffer;
    a holding capacitor connected between the input port of said buffer and a reference potential;
    a feedback means connected to the output port of said buffer and coupled to the other input port of said amplifier, and
    a correction sample-and-hold means having an input node and an output node, the input node being connected to the output port of said amplifier, said correction sample-and-hold means being responsive to switching feedthrough error generated by said sampling switch, the output node of said correction sample-and-hold means being coupled to one side of said holding capacitor by an attenuating means for transferring a correction charge to said holding capacitor.

2. The apparatus defined in claim 1 wherein said correction sample-and-hold means comprises:
    a correction sampling switch and a correction capacitor connected in series, respectivley, between the output port of said amplifier and a reference potential, and
    said attenuating means connected between the common node of said correction sampling switch and said correction capacitor and adapted to transfer the correction charge to said holding capacitor.

3. The apparatus defined in claim 2 wherein said coupling means comprises a correction coupling capacitor connected between the input port of said buffer and the common node of said correction sampling switch and said correction capacitor, said correction coupling capacitor having a capacitance substantially less than that of said holding capacitor.

4. The apparatus defined in claim 3 and comprising a correction zeroing switch connected between a reference potential and the common node of said correction capacitor and said correction sampling switch.

5. The method of sampling and holding a signal in a sample-and-hold circuit, comprising the steps of sampling and holding an input signal by means of a primary feedback sample-and-hold circuit to generate a primary held signal, and thereafter sampling and holding an amplified version of the voltage difference between the input signal and the primary held signal to generate a secondary, correction held signal, and combining an attenuated form of the correction held signal with the primary held signal.

6. A sample-and-hold circuit apparatus, comprising;

first, second, and third capacitors, the second capacitor being connected between one side of each of the first and third capacitors, and another side of each of the first and third capacitors being connected to a reference voltage, the common node of said first and second capacitors forming a primary signal node and the common node of said second and third capacitors forming a secondary, correction node;

primary sampling switch means connected at one side to said primary signal node for selectively connecting said primary signal node to a signal input node;

a first, buffer amplifier having an input connected to the primary signal node and having its output forming an output node for the circuit;

correction feedback means, including a second, differential amplifier having first and second input ports and an output port, one of its input ports being coupled to the signal input node, the other of its input ports being coupled to the output node of the circuit, and its output port being coupled to the correction node through a correction sampling switch, said differential amplifier being responsive to a signal voltage error in the form of the difference between the voltage of the signal input node and the voltage of the output node of the circuit to correct the signal voltage error at said output node of the circuit upon disconnection of the primary signal node from the signal input node by said primary sampling switch means by substantially eliminating the difference.

7. A sample-and-hold circuit, comprising:

a sampling switch connected at one side to a signal input node;

a holding capacitor connected between the other side of sampling switch and a reference potential;

first, buffer amplifier means having an input connected to the common node of the sampling switch and the holding capacitor and having an output forming an output node for the circuit;

second, differential amplifier means having two input ports and an output port, one input port being connected to the signal input node and the other input port being selectively connected to the output node, for generating a correction voltage at its output port in response to the voltage difference between them;

a correction switch connected at one side to the output port of the second amplifier means;

a correction capacitor connected between the other side of the correction switch and a reference potential, and attenuating coupling means between the other side of the sampling switch and the other side of the correction switch for applying the correction voltage to the holding capacitor.

8. The apparatus defined in claim 7 wherein the attenuating coupling means includes a coupling capacitor having one side connected to the other side of the sampling switch.

9. A method of sampling and holding a signal, comprising:

sampling and holding an input signal by means of a given process to establish a primary held signal, then comparing the primary held signal to the input signal and generating a secondary, correction held signal which has a magnitude reflecting the difference between the input signal and the primary held signal, the correction signal being coupled to the primary held signal in an attenuated manner to substantially correct the primary held signal magnitude by transferring a signal correction quantity to means for holding the primary held signal.

* * * * *